(12) United States Patent
Grodzki et al.

(10) Patent No.: US 10,254,364 B2
(45) Date of Patent: Apr. 9, 2019

(54) OPTIMIZING A SLICE ORIENTATION

(71) Applicants: David Grodzki, Erlangen (DE); Thorsten Speckner, Erlangen (DE)

(72) Inventors: David Grodzki, Erlangen (DE); Thorsten Speckner, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 172 days.

(21) Appl. No.: 15/230,674

(22) Filed: Aug. 8, 2016

(65) Prior Publication Data

US 2017/0045594 A1    Feb. 16, 2017

(30) Foreign Application Priority Data

Aug. 12, 2015    (DE) .................. 10 2015 215 368

(51) Int. Cl.
*G01V 3/00*    (2006.01)
*G01R 33/483*    (2006.01)
(Continued)

(52) U.S. Cl.
CPC ....... *G01R 33/4833* (2013.01); *G01R 33/385* (2013.01); *G01R 33/543* (2013.01)

(58) Field of Classification Search
CPC ............ G01R 33/5601; G01R 33/5608; G01R 33/4833; G01R 33/5676; G01R 33/281;
(Continued)

(56) References Cited

U.S. PATENT DOCUMENTS 5,278,506 A    1/1994  Schmitt
7,945,305 B2 *  5/2011  Aggarwal .......... G01R 33/5673
                                                600/407
(Continued)

FOREIGN PATENT DOCUMENTS

CN    101744617 A    6/2010
CN    104515965 A    4/2015
(Continued)

OTHER PUBLICATIONS

German Office Action for related German Application No. 10 2015 215 368.1 dated Oct. 12, 2016, with English Translation.
(Continued)

*Primary Examiner* — Vinh Nguyen
(74) *Attorney, Agent, or Firm* — Lempia Summerfield Katz LLC

(57) ABSTRACT

A method for optimizing a slice orientation for an examination using a magnetic resonance machine is provided. One or more device limitation of the magnetic resonance machine is provided. The device limitation includes, for at least one of the one or more gradient axes, a maximum gradient strength and/or a maximum gradient slew rate. At least one measurement parameter value of the examination and an original slice orientation are also provided. Rotational-angle information is determined from device limitations, measurement parameter values, and the original slice orientation. The rotational-angle information is used to optimize the original slice orientation, and the magnetic resonance machine captures measurement data on the basis of the optimized slice orientation.

16 Claims, 4 Drawing Sheets

(51) Int. Cl.
*G01R 33/385* (2006.01)
*G01R 33/54* (2006.01)

(58) Field of Classification Search
CPC .. G01R 33/4828; G01R 33/54; G01R 33/543; G01R 33/5602; G01R 33/56366; G01R 33/56509; G01R 33/56563; G01R 33/286; G01R 33/56375; G01R 33/56383; G01R 33/56572; G01R 33/5659; G01R 33/246; G01R 33/28; G01R 33/283; G01R 33/3415; G01R 33/3806; G01R 33/443; G01R 33/483; G01R 33/4836; G01R 33/546; G01R 33/56; G01R 33/5619; G01R 33/56308; G01R 33/56325; G01R 33/565; G01R 33/56545; G01R 33/567; G01R 33/5673; G01R 33/58; G06F 19/321; G06F 19/3481; G06F 3/011; G06F 3/0346; G06F 3/04815; G06F 3/0484; A61B 2034/102; A61B 34/10; A61B 6/4417; A61B 6/505; A61B 6/583; A61B 6/12; A61B 6/464; A61B 6/481; A61B 6/482; A61B 2034/105; A61B 5/742; A61B 17/15; A61B 17/1703; A61B 2576/02; A61B 5/05; A61B 6/5247; A61B 8/00; A61B 8/13; A61B 2090/064; A61B 2090/374; A61B 5/721; A61B 5/7289; A61B 5/7425; A61B 8/46
See application file for complete search history.

(56) References Cited

U.S. PATENT DOCUMENTS

| | | | |
|---|---|---|---|
| 9,097,777 B2 * | 8/2015 | Weber | G01R 33/4833 |
| 2006/0224062 A1 | 10/2006 | Aggarwal | |
| 2010/0160766 A1 | 6/2010 | Greiser | |
| 2012/0025826 A1 | 2/2012 | Zhou et al. | |
| 2012/0262171 A1 | 10/2012 | Weber | |
| 2015/0091574 A1 | 4/2015 | Campagna | |
| 2015/0115960 A1 | 4/2015 | Grodzki | |

FOREIGN PATENT DOCUMENTS

| | | |
|---|---|---|
| DE | 4107515 A1 | 9/1992 |
| DE | 102011007501 B3 | 5/2012 |
| DE | 102013221938 A1 | 4/2015 |
| EP | 2511725 A1 | 10/2012 |
| JP | 2009279218 A | 12/2009 |

OTHER PUBLICATIONS

Chinese Office Action for Chinese Application No. 201610579465.6, dated Aug. 31, 2018, with English Translation.

* cited by examiner

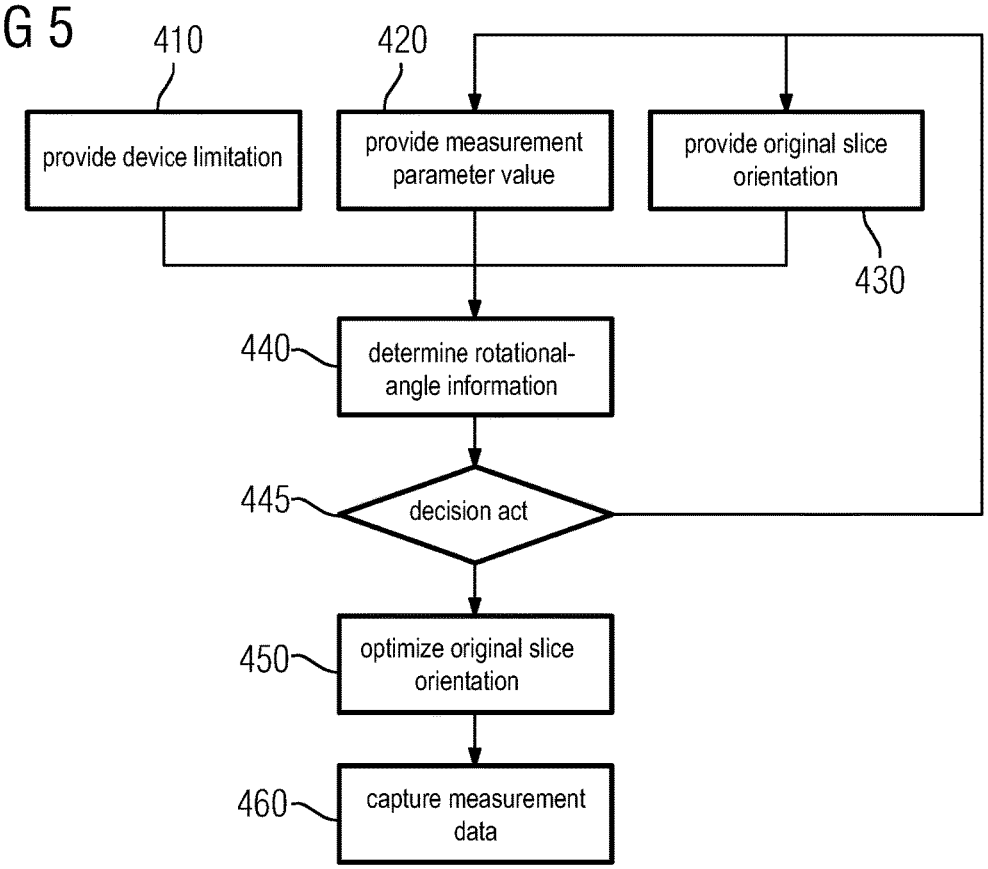

OPTIMIZING A SLICE ORIENTATION

CROSS-REFERENCE TO RELATED APPLICATION

This application claims priority under 35 U.S.C. § 119 to German Patent Application No. 102015215368.1, filed on Aug. 12, 2015, the entire content of which is incorporated herein by reference.

FIELD

The description relates to a method for optimizing a slice orientation for an examination using a magnetic resonance machine, to a magnetic resonance machine and to a computer program product.

BACKGROUND

Tomographic examinations such as computer tomography (CT) or magnetic resonance imaging (MRI) are now common practice as part of clinical imaging. In MRI examinations, magnetic resonance signals are captured from a slice, e.g. from a thin, three-dimensional cuboid. The slice orientation, e.g. the angular alignment of the slice in a three-dimensional space, gives the orientation of the image plane of the cross-sectional image. Whereas in CT, fluoroscopic images are captured along a spiral trajectory and then reconstructed, MRI can be used to produce cross-sectional images directly in any orientation.

MRI image production is done by superimposing two or more gradient fields on a homogeneous main magnetic field. Each gradient field may be produced by a fixed gradient coil. The gradient fields may be oriented along a gradient axis, e.g. a gradient coil can be used to produce a magnetic field that rises or falls linearly and is parallel to these physical gradient axes. These physical gradient axes are mutually orthogonal, e.g., oriented perpendicular to one another, and may be labeled as the x-axis, y-axis and z-axis.

Each gradient coil normally has a limit on a possible gradient strength, e.g. on an amplitude of the gradient field that can be produced by the gradient coil and a limit on a gradient slew rate, e.g. on a rate of rise of the gradient fields.

SUMMARY AND DESCRIPTION

Rotating a given slice orientation changes the orientation of a resultant gradient field arising from the superposition of the two or more gradient fields. Hence, this also changes the distribution of the gradient strengths on the gradient axes concerned in order to produce the required resultant gradient field.

The object of the present embodiments is to provide a method and corresponding devices that allow optimum utilization of the gradient coils.

A method for optimizing a slice orientation for an examination using a magnetic resonance machine having one or more gradient axes is provided. The method includes providing at least one device limitation of the magnetic resonance machine. The at least one device limitation includes, for at least one of the one or more gradient axes, a maximum gradient strength and/or a maximum gradient slew rate. At least one measurement parameter value of the examination and an original slice orientation are also provided. Rotational-angle information is determined from the at least one device limitation and from the at least one measurement parameter value and the original slice orientation. The rotational-angle information is used to optimize the original slice orientation, and the magnetic resonance machine captures measurement data on the basis of the optimized slice orientation.

A magnetic resonance machine may have three gradient coils that each define a gradient axis. Gradient axes are coincident with the coordinate axes of the magnetic resonance machine. For a magnetic resonance machine having a cylindrical patient receiving zone, a center axis of the cylinder is often defined as the z-axis. The x-axis runs perpendicular to the z-axis, often horizontally, and the y-axis in turn then runs perpendicular to the x-axis and z-axis.

The at least one device limitation advantageously defines a limit that is taken into account in optimizing the slice orientation, e.g. the slice orientation is adjusted such that the at least one device limitation is not exceeded. The maximum gradient strength, often given in the dimensional units mT/m, and the maximum gradient slew rate, often given in the dimensional units T/m/s, are intrinsic to the design of the gradient coil concerned and hence constitute equipment-specific boundary conditions for operating the magnetic resonance machine. The device limitation can be provided, for example, by a provider unit via a read operation from an electronic memory.

The at least one measurement parameter value of the examination can define the manner in which the magnetic resonance machine is meant to be operated during the examination. In particular, the at least one measurement parameter value can be a pulse sequence. The pulse sequence can be stored as echo times (TE), repetition times (TR), inversion times (TI), flip angles, etc. The pulse sequence can define, inter alia, a contrast for the image to be produced. The at least one measurement parameter value can be provided, for example, by a provider unit via a read operation from an electronic memory.

The original slice orientation may be an orientation of a slice that results from a possible given pulse sequence. The at least one measurement parameter value of the examination may include the original slice orientation. Any specified slice orientation may be used, e.g. a transverse plane perpendicular to the z-axis. Original slice orientation can be used by default as a reference orientation. The original slice orientation can be provided, for example, by a provider unit via a read operation from an electronic memory.

The at least one device limitation and the at least one measurement parameter value and the original slice orientation can be thought of as input values. The input values may be used by an analysis unit to determine rotational-angle information. The rotational-angle information advantageously includes at least one item of information, in particular, at least one angle and/or at least one angle range that can be used to rotate the original slice orientation in such a way that utilization of the gradient coils is optimum.

Rotating a slice orientation is equivalent to rotating one or more gradient strength vectors that define the slice orientation. A three-dimensional gradient strength vector G can be represented in three dimensions by $G=(G_x, G_y, G_z)$, where $G_x$, $G_y$ and $G_z$ are components that combine to give the vector. For example, $G_x$ is the gradient strength parallel to the x-axis, etc. A gradient slew rate vector can also be described analogously by $S=(S_x, S_y, S_z)$. All the following mathematical expressions for the gradient strength can also be applied analogously to the gradient slew rate.

A rotation of a three-dimensional gradient vector G can be expressed mathematically by $G'=R\ G$, where $G'$ is the rotated vector and R is a rotation matrix. For a rotation about the x-axis, the rotation matrix can be described, for example, by:

$$R_x(\theta) = \begin{bmatrix} 1 & 0 & 0 \\ 0 & \cos\theta & -\sin\theta \\ 0 & \sin\theta & \cos\theta \end{bmatrix}$$

A rotation can be performed analogously about the other physical axes y and z.

The performance of the gradient system is increased because any limitations that would be needed to select the slice orientation completely independently of the at least one measurement parameter value. For instance, only about 58 percent of the physically maximum possible gradient strength for a physical gradient axis is needed to prevent a possible rotation of an original slice orientation leading to, in the worst case, a distribution of the resultant gradient strengths that would involve an overload of a gradient coil. The image quality can be increased and/or examination times reduced by the optimized utilization of the gradient system. One of the reasons why this is possible is that the time length of gradient pulses can potentially be reduced by increasing the gradient strength and/or gradient slew rate. This applies to gradient pulses that are applied at a time offset from RF pulses and/or readout time periods, because the moment of the gradient pulse, e.g. the integral over time of the gradient strength, is often the decisive factor.

The at least one device limitation may include a variable buffer, e.g. a reserve and/or a safety margin. By adjusting a buffer, the device limitation to be applied can be manipulated. The maximum gradient strength and/or maximum gradient slew rate can be manipulated within the limits of the magnetic resonance machine that are physically possible and/or technically possible for the equipment. For instance, if the requirement is to utilize an actually maximum performance of the gradient coils, the buffer is set to zero, e.g. values are selected for the gradient axes that are the maximum gradient strength and/or maximum gradient slew rate that can still be achieved by the magnetic resonance machine.

According to one embodiment, the at least one rotational-angle information includes information as to whether a possible rotation of the original slice orientation exists for which the at least one device limitation is exceeded.

In particular, a test can be performed for at least one point in time of a pulse sequence as to whether the maximum gradient strength and/or the maximum gradient slew rate on the one or more gradient axes may be exceeded if the original slice orientation is rotated through any angle. This test can advantageously be applied to time intervals of a pulse sequence that need the highest gradient strengths and/or the gradient slew rates.

The one or more points in time, in particular time intervals, are provided before determining the rotational-angle information, for instance provided via a user interface. It is possible in particular that the one or more points in time are provided using color coding, e.g. information that represents one or more points in time has a characteristic color.

Assuming that the maximum gradient strength $G_{max}$ is identical for three orthogonal gradient axes, a possible rotation of an original slice that results in the maximum gradient strength $G_{max}$ being exceeded exists when the following condition is met:

$$G_x^2 + G_y^2 + G_z^2 > G_{max}^2$$

where the original slice is characterized by the gradient vector $G=(G_x, G_y, G_z)$. An analogous condition can be defined for the gradient slew rates:

$$S_x^2 + S_y^2 + S_z^2 > S_{max}^2$$

Thus if this condition does not exist for any of the points in time considered, then the original slice can be rotated through any angle without the at least one measurement parameter of the examination having to be changed, because this rotation cannot cause the at least one device limitation to be exceeded.

According to another embodiment, the rotational-angle information includes at least one angle range, inside which a rotation of the original slice orientation can be performed without exceeding the at least one device limitation. Provided the rotation is made inside the at least one angle range, also referred to as an angle interval, the original slice can be rotated without the at least one measurement parameter of the examination needing to be changed. The angle range can be defined by limit angles. Without loss of generality, for the example, the case where $G_z=0$, a limit angle $\theta_z$ for a rotation about the z-axis can be calculated from $$\theta_z = \arcsin\frac{G_{max}}{\sqrt{G_x^2 + G_y^2}} - \arctan\frac{G_y}{G_x}$$

Limit angles can also be calculated analogously for the x-axis and y-axis and for the gradient slew rate.

In addition, the at least one angle range can be calculated for a plurality of points in time. An intersecting set giving a resultant angle range can advantageously be formed from the resulting plurality of angle ranges, e.g. a rotation inside the resultant angle range is possible without the at least one device limitation being exceeded at any of the points in time considered.

According to one embodiment, the method includes an additional act in which at least one angle value is defined inside or outside the angle range, wherein the original slice orientation is optimized using the angle value. When the at least one angle value is defined outside the angle range, the at least one measurement parameter value of the examination and/or the at least one device limitation is changed. In this case, the at least one measurement parameter value of the examination and/or the at least one device limitation is changed such that a rotation of the original slice orientation through the defined angle value can be performed without the at least one device limitation being exceeded. The at least one device limitation can be changed by adjusting the variable buffer, for example.

The at least one measurement parameter value of the examination and/or the at least one device limitation can be changed iteratively, e.g. the at least one measurement parameter value of the examination and/or the at least one device limitation can be repeatedly changed until the at least one device limitation is no longer exceeded.

The definition of the at least one angle value inside or outside the angle range can be assisted by being displayed e.g. using a display unit. The definition of the angle value and/or angle region may be generated in color, e.g., as a red line and/or green region. Hence a potential operator is able to define the at least one angle value easily.

In another embodiment of slice orientation optimization, the rotational-angle information includes a preference angle. On rotating the original slice orientation through the preference angle, a gradient strength and/or a gradient slew rate is distributed at least onto two gradient axes. Thus, advantageously a preferred angle is provided to a potential operator for which it is possible to achieve optimum timing while utilizing the gradient system in full.

On rotating the original slice orientation through the preference angle, a resultant gradient strength and/or gradient slew rate on each of at least two gradient axes may have an equal fraction of the corresponding maximum gradient strength and/or maximum gradient slew rate. The physical capabilities of the magnetic resonance machine can thereby be utilized efficiently because the maximum possible gradient strength and/or gradient slew rate can be achieved on each of the at least two gradient axes by increasing the gradient strength and/or the gradient slew rate by the reciprocal of the equal fraction. Thus using the preference angle, the respective resultant gradient strengths and/or gradient slew rates may be increased to the maximum gradient strength and/or the maximum gradient slew rate. Hence the capabilities of the magnetic resonance machine can be utilized in full.

The maximum gradient strength and/or maximum gradient slew rate are often of equal magnitude on all the gradient axes. In this case, the respective resultant gradient strengths and/or gradient slew rates are the same on the at least two gradient axes. For instance, for a rotation about the z-axis, the preference angle $\varphi$ is given by $$\varphi_z = \arctan{-\frac{G_y}{G_x}} + \frac{\pi}{4}$$

It is also proposed that a preference angle is determined for each of a plurality of points in time of a pulse sequence, and a resultant preference angle is determined from the plurality of preference angles. Rotating the original slice orientation through the resultant preference angle prevents the at least one device limitation being exceeded for the plurality of points in time, in particular time intervals. The resultant preference angle can be determined iteratively from the plurality of preference angles.

In particular, a superimposed gradient strength and/or a superimposed gradient slew rate can be maximized over the plurality of points in time of the pulse sequence by rotating the original slice orientation through the resultant preference angle. The achievable gradient strengths and/or gradient slew rates may be determined for each of the plurality of points in time, and the combination selected for which the largest values are achieved.

According to another embodiment, measurement data is captured from an in particular three-dimensional volume which includes at least two different slices having optimized slice orientation, wherein a cross-sectional image is reconstructed from the measurement data, the orientation of which image differs from the optimized slice orientation, in particular equals the original slice orientation.

Thus it is possible to capture measurement data from a three-dimensional volume slice-by-slice on the basis of a slice orientation arising from a rotation of the original slice orientation through the preference angle and/or the resultant preference angle. A cross-sectional image is reconstructed from measurement data that corresponds to the original slice orientation, e.g. to generate an image that ultimately is in the originally intended orientation. Reconstruction can be performed, for example, using a gridding method known to a person skilled in the art. The gridding method may use interpolation and extrapolation techniques to project discrete values onto a uniform grid. This is particularly advantageous for fat-saturated measurements that are outside regions containing vessels in which flow levels are high, which measurements experience minimum possible artifacts as a result of chemical shift.

In addition, a magnetic resonance machine is proposed that is configured to perform a method for optimizing a slice orientation for an examination using a magnetic resonance machine. The magnetic resonance machine includes one or more gradient axes, a provider unit for providing at least one device limitation of the magnetic resonance machine, at least one measurement parameter value and an original slice orientation, and an analysis unit for determining rotational-angle information and for optimizing the original slice orientation using the rotational-angle information.

The magnetic resonance machine may also include a user interface for adjusting a buffer and/or for outputting an angle range and/or for defining an angle value and/or for changing a measurement parameter value of the examination and/or for changing the device limitation.

The advantages of the magnetic resonance machine according to the disclosed embodiments for optimizing a slice orientation may provide similar advantages of the method for optimizing a slice orientation for an examination using a magnetic resonance machine having one or more gradient axes, explained in detail above. Features, advantages or alternative embodiments mentioned in this connection can also be applied to the other claimed subject matter, and vice versa.

In other words, the claims relating to physical objects can also be developed by combining with the features described or claimed in connection with a method. The corresponding functional features of the method are embodied by corresponding physical modules, in particular, by hardware modules.

In addition, a computer program product includes a program and can be loaded directly into a memory of a programmable processing unit of a magnetic resonance machine. The program, as executed by a processor, can perform a method for optimizing a slice orientation for an examination using a magnetic resonance machine having one or more gradient axes when the program is executed in the processing unit of the magnetic resonance machine.

Said computer program product can include software containing a source code, which still needs to be compiled and linked or just needs to be interpreted. The computer program product can include executable software code that for execution only needs to be loaded into the memory of the processing unit of the magnetic resonance machine. The method can be performed quickly, reproducibly and robustly by the computer program product. The computer program product is configured such that it can use the processing unit to perform the disclosed method. The processing unit includes, for example, a suitable RAM, a suitable graphics card or a suitable logic unit, in order to be able to perform the respective method acts efficiently. The computer program product is stored, for example, on a computer-readable medium or on a network or server, from where it can be loaded into a processor of the system control unit. Examples of computer-readable media are a DVD, a magnetic tape or a USB stick, on which is stored electronically-readable control data, in particular software. Hence, embodiments for optimizing slice orientation can also proceed from said computer-readable medium.

The scope of the present invention is defined solely by the appended claims and is not affected to any degree by the statements within this summary. The present embodiments may obviate one or more of the drawbacks or limitations in the related art.

DESCRIPTION OF THE FIGURES

Further advantages, features and details appear in the exemplary embodiments described below and follow from the drawings. Corresponding parts are denoted by the same reference signs in all the figures, in which:

FIG. 5 depicts a block diagram of an extended method of another embodiment of optimizing a slice orientation.

DETAILED DESCRIPTION

Figure 1:
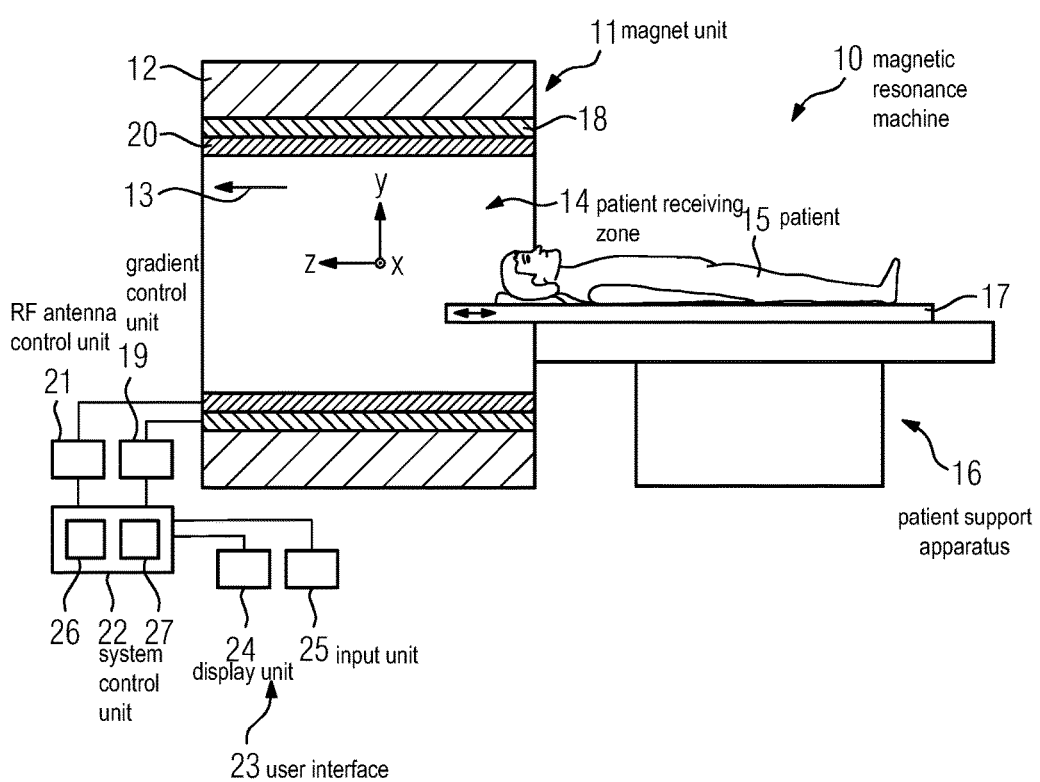
FIG. 1 depicts a diagram of one embodiment of a magnetic resonance machine for optimizing a slice orientation.

FIG. 1 depicts schematically a magnetic resonance machine 10 for optimizing a slice orientation. The magnetic resonance machine 10 includes a magnet unit 11 that contains a superconducting main magnet 12 for producing a powerful main magnetic field 13. The main magnetic field is constant over time. The magnetic resonance machine 10 also includes a patient receiving zone 14 for accommodating a patient 15. In the present exemplary embodiment, the patient receiving zone 14 is shaped as a cylinder and is enclosed in a circumferential direction cylindrically by the magnet unit 11. In principle, however, it is possible for the patient receiving zone 14 to have a different design. The patient 15 can be moved into the patient receiving zone 14 by a patient support apparatus 16 of the magnetic resonance machine 10. The patient support apparatus 16 includes a patient table 17 that is configured to be able to move inside the patient receiving zone 14.

The magnet unit 11 further includes a gradient coil unit 18 for producing gradient fields that can also be referred to as magnetic field gradients. The gradient coil unit 18 may include one gradient coil for each of the three spatial directions x, y, z. Each gradient coil is correspondingly associated with a gradient axis, e.g., the gradient coil that can produce a gradient field parallel to the spatial direction x is associated with the x-axis, etc. A gradient field may exhibit a spatially varying magnetic field and can be characterized, inter alia, by its gradient strength. The gradient strength defines how sharply an amplitude of the spatially varying magnetic field changes. The gradient strength can be understood to be a spatial derivative of the amplitude of the magnetic field and is therefore given in the dimensional units milli-Tesla per meter (mT/m). The gradient strength of a gradient coil is approximately constant in the measurement region.

The gradient coil unit 18 is controlled by a gradient control unit 19 of the magnetic resonance machine 10. The magnet unit 11 also includes an RF antenna unit 20, configured as a body coil that is permanently built into the magnetic resonance machine 10. The RF antenna unit 20 is configured to excite nuclear spins that are established in the main magnetic field 13 and produced by the main magnet 12. The RF antenna unit 20 is controlled by an RF antenna control unit 21 of the magnetic resonance machine 10. The RF antenna unit 20 radiates radio frequency (RF) excitation pulses into an examination space that may be largely formed by a patient receiving zone 14 of the magnetic resonance machine 10. The RF antenna unit 20 is also configured to receive magnetic resonance signals emitted by the excited nuclear spins.

The magnetic resonance machine 10 includes a system control unit 22 for controlling the main magnet 12, the gradient control unit 19 and the RF antenna control unit 21. The system control unit 22 centrally controls the magnetic resonance machine 10, for instance implementing a predetermined imaging gradient echo sequence. The system control unit 22 is configured, inter alia, to analyze medical image data captured during the magnetic resonance examination. In addition, the system control unit 22 includes a provider unit 26 for providing at least one device limitation of the magnetic resonance machine 10, at least one measurement parameter value and an original slice orientation, and an analysis unit 27 for determining rotational-angle information and for optimizing the original slice orientation using the rotational-angle information. The system control unit 22 also includes a memory that may not be presented in greater detail here, into which can be loaded a program for performing a method for optimizing a slice orientation for an examination using the magnetic resonance machine 10.

In addition, the magnetic resonance machine 10 includes a user interface 23 that may be connected to the system control unit 22. Control data such as imaging parameters and/or angle ranges, for instance, and reconstructed magnetic resonance images can be displayed to medical personnel on a display unit 24, for example on at least one monitor, of the user interface 23. The user interface 23 further includes an input unit 25, which can be used by the medical operating personnel to enter information, in particular a buffer and/or angle value and/or a measurement parameter value of an examination and/or a device limitation, during a measurement procedure.

In the present exemplary embodiment, the magnetic resonance machine 10 shown can obviously include further components typically present in magnetic resonance machines. Furthermore, since a person skilled in the art knows how a magnetic resonance machine 10 works in general, a detailed description of the general components is not given.

Figure 2:
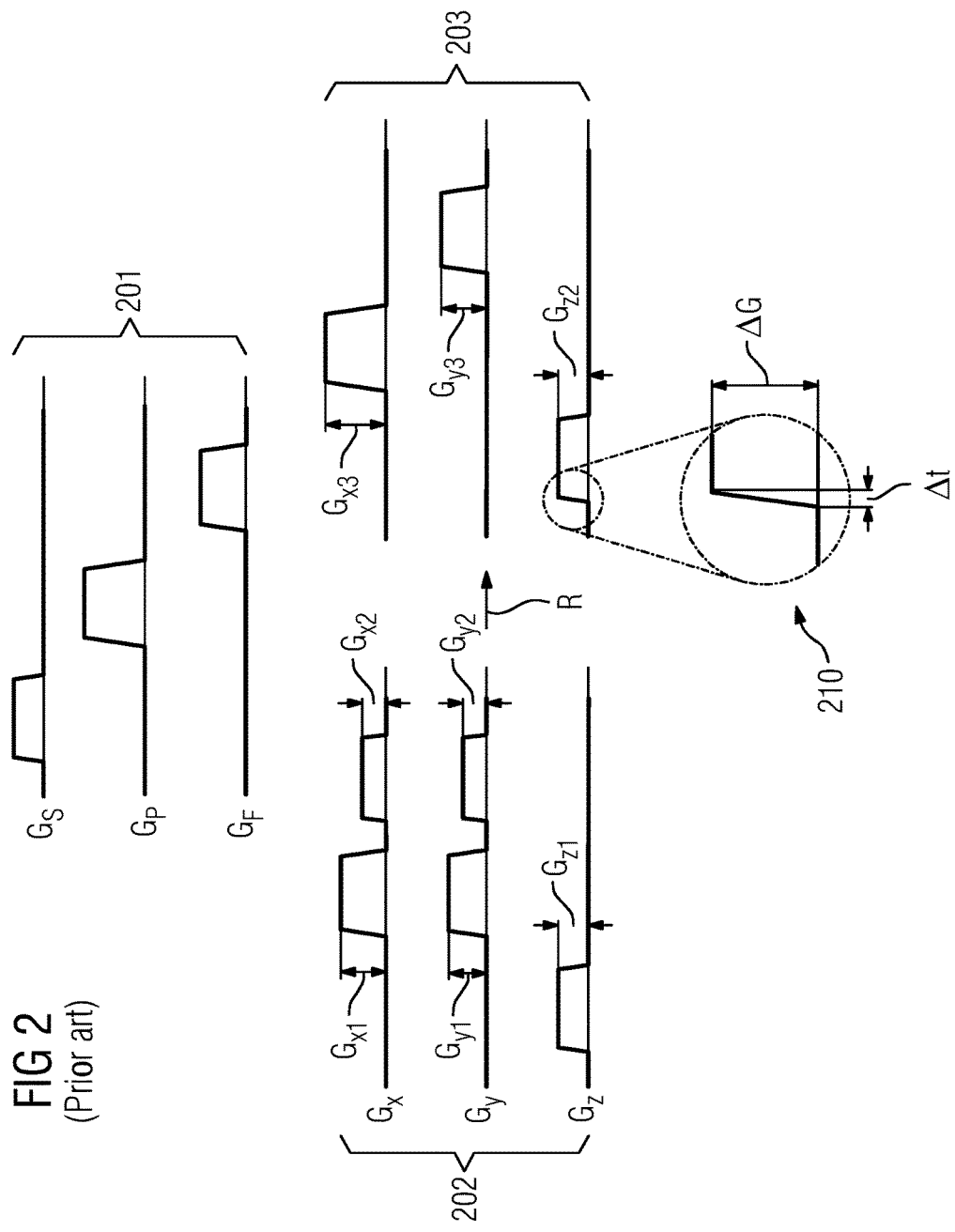
FIG. 2 depicts a gradient diagram according to the prior art.

The gradient fields, which can be produced by the gradient coil unit 18, are used for spatial encoding during an imaging process. FIG. 2 depicts a gradient diagram, e.g. a timing diagram of gradient pulses, often also abbreviated to gradients, according to the prior art. For the purpose of spatial encoding, various gradients $G_S$, $G_F$ and $G_P$ are switched consecutively in the subdiagram 201. Gradients $G_S$, $G_F$ and $G_P$ are associated with logical gradient axes that may not be the same as the physical gradient axes, e.g. the x-axis, the y-axis and the z-axis.

$G_S$ here denotes a slice-selection gradient. In order to depict a cross-sectional image of the patient 15, the required body slice is excited selectively by switching the slice-selection gradient $G_S$ orthogonal to the required image plane while the RF antenna unit 20 emits an RF pulse.

Between RF excitation pulse and readout of the magnetic resonance signals, a phase-encoding gradient $G_P$ is switched briefly, which imposes a line-by-line phase shift on the nuclear spins. A subsequent Fourier transformation by the system control unit 22 can reassign the different phases to the lines corresponding to said phases.

While the magnetic resonance signal is being received, a frequency-encoding gradient $G_F$ is switched, which imposes linearly increasing precession frequencies on the nuclear spins. The magnetic resonance signal that is read out is a continuous mix of all these frequencies. Technical processes can be used to filter these different frequencies back into individual frequencies. The location of the nuclear spins in the line direction can be reconstructed again based on the frequency.

The gradients $G_S$, $G_F$ and $G_P$ are distributed onto the physical gradient axes x, z and z according to the required orientation of the plane of the cross-sectional image. Whereas for orthogonal, e.g. sagittal, coronal and/or transverse, cross-sectional images, normally only one of the three physical gradient axes, e.g. only one of the three gradient coils, is used during one point in time, oblique slices or double oblique slices are excited by simultaneously switching two or three gradient fields. Thus in an example slice orientation that may be defined on the physical gradient axes x, y, z by the gradients $G_x$, $G_y$ and $G_z$ shown in subdiagram 202, the phase-encoding gradient $G_P$ and the frequency-encoding gradient $G_F$ are created by simultaneous switching of gradients on the x-axis and the y-axis, e.g. the phase-encoding gradient $G_P$ and the frequency-encoding gradient $G_F$ each result from a superposition of two gradient fields. Thus, for example, the phase-encoding gradient $G_P$ is composed from the physical gradients that have the gradient strengths $G_{x1}$ and $G_{y1}$.

An example rotation R of 45° about the z-axis produces from the slice orientation corresponding to subdiagram 202, which can also be referred to here as the original slice orientation, a new slice orientation corresponding to the subdiagram 203. The result in this example is that the phase gradient $G_P$ is now applied solely along the x-axis and assumes the gradient strength $G_{x3}$.

The gradient strength of a physical gradient axis may be limited by the technical limits of the equipment, e.g. each gradient coil can only produce gradient fields up to a maximum gradient strength. In addition, the gradient fields can be established only at a maximum rate, e.g. the gradient slew rates are also limited. Subdiagram 210 illustrates a slew rate. As depicted, the gradient changes by the gradient amplitude ΔG in the time Δt, e.g. the gradient slew rate equals ΔG/Δt. Thus, the gradient slew rate is often given in the dimensional units of Tesla per meter per second (T/m/s). Like the gradient strengths, the gradient slew rates can also be superimposed by simultaneous switching of gradients on different physical gradient axes.

FIG. 2 relates to an example that aims to explain how the gradient system works and to explain relationships between the gradients using a slice orientation according to the prior art. In particular, the selected gradient diagram, which can be understood to be part of a pulse sequence, has no limiting effect whatsoever on the optimization of slice orientation.

Figure 4:
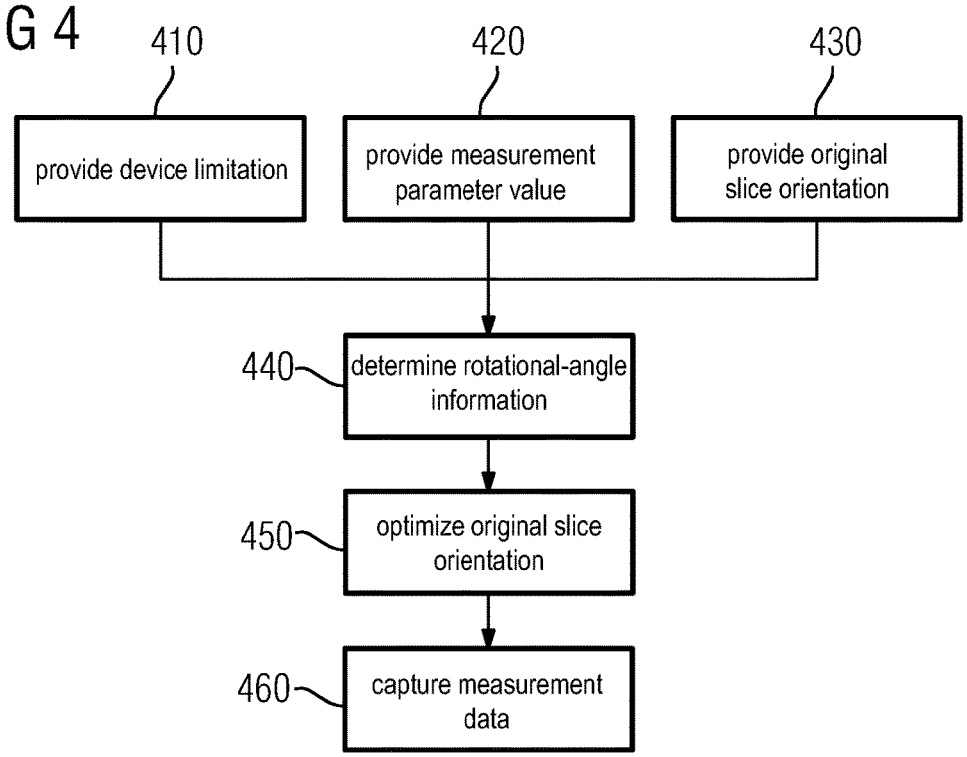
FIG. 4 depicts a block diagram of a method of an embodiment of optimizing a slice orientation.

FIG. 4 illustrates an embodiment of a method for optimizing a slice orientation for an examination using a magnetic resonance machine 10 having one or more gradient axes x,y,z.

In act 410, the provider unit 26 provides at least one device limitation of the magnetic resonance machine 10. The least one device limitation includes, for at least one gradient axe, a maximum gradient strength and/or a maximum gradient slew rate. The at least one device limitation can be saved in a memory of the system control unit 22, from where the limitation can be retrieved. The at least one device limitation can include $G_{max,x}$, $G_{max,y}$, $G_{max,z}$, $S_{max,x}$, $S_{max,y}$, $S_{max,z}$ for example, wherein $G_{max,x}$, $G_{max,y}$ and $G_{max,z}$ are maximum gradient strengths and $S_{max,x}$, $S_{max,y}$ and $S_{max,z}$ are maximum gradient slew rates on the physical gradient axes x, y and z. The gradient coil unit 18 may be configured such that an identical value can be used for the maximum gradient strengths, and hence $G_{max,x}=G_{max,y}=G_{max,z}=G_{max}$. The gradient coil unit 18 may be configured such that an identical value can be used for the maximum gradient slew rates, and hence $S_{max,x}=S_{max,y}=S_{max,z}=S_{max}$.

In act 420, the provider unit 26 provides at least one measurement parameter value of the examination. The at least one measurement parameter value of the examination can be pre-saved in a memory of the system control unit 22, from where the parameter value can be retrieved, for example in the form of an existing pulse sequence.

In act 430, the provider unit 26 provides an original slice orientation. The original slice orientation may already be contained in the at least one measurement parameter value of the examination because a pulse sequence can contain gradient pulses that can be linked to a slice orientation, as illustrated in FIG. 2.

In act 440, the analysis unit 27 determines rotational-angle information from the at least one device limitation and from the at least one measurement parameter value and the original slice orientation. The rotational-angle information can include preferred angles or angle ranges that can be used in act 450 to optimize the original slice orientation. The optimization can result, in particular, in improved utilization of the available equipment technology, allowing the selection of potential parameter combinations that would not be possible without such an optimization act.

In act 460, the magnetic resonance machine 10 can be used to capture measurement data, in particular magnetic resonance signals, on the basis of the optimized slice orientation.

The at least one device limitation can include a variable buffer. Instead of inputting into act 440 the maximum values, e.g. for the gradient strength and/or the gradient slew rate, that are technically possible for the equipment, smaller values are input. The smaller values are used as a maximum gradient strength and/or a maximum gradient slew rate, e.g. $G_{max}=p\,G_{max,g}$ and/or $S_{max}=p\,S_{max,g}$, where p is a number between zero and 1, and $G_{max,g}$ and $S_{max,g}$ are maximum values for the gradient strength and the gradient slew rate that are technically possible for the equipment.

A test is performed in act 440 as to whether any rotations are actually possible that would result in at least one device limitation being exceeded. The test may be performed for a plurality of points in time. If applicable, the test may be performed for all the points in time of a pulse sequence. If a pulse sequence is divided into time increments of ten microseconds, for instance, the test can be performed after each time increment.

If rotations are possible that would result in the at least one device limitation being exceeded, additionally in act 440, an angle range can be determined inside which a rotation of the original slice orientation can be performed without the at least one device limitation being exceeded. By defining at least one angle value inside the determined angle range, the original slice orientation is optimized in act 450 using the defined angle values.

FIG. 5 depicts an embodiment of the method for optimization of slice orientation, including a decision act 445. Act 445 provides a branch operation according to the definition of the at least one angle value. If the at least one angle value is defined inside the determined angle range, the original slice orientation is optimized directly as already described. If, on the other hand, the at least one angle value is defined outside the angle range, the at least one measurement parameter value of the examination and/or the at least one device limitation is changed. The change may involve, for example, adjusting the variable buffer and/or varying the timing of the pulse sequence. For example, phase-encoding gradients could be extended while maintaining their moments. The act 445 allows an iterative optimization of the measurement parameters because multiple cycles of the acts 420, 430, 440, 445 can be performed.

In another embodiment, a preference angle can be determined in act 440, for which optimum timing with full utilization of the gradients is achieved. A rotation through the preference angle can result in a slice orientation that differs from the original slice orientation. However, after capturing the measurement data, an image is generated by the gridding method in order to obtain the cross-sectional image that corresponds to the original slice orientation. This can be particularly advantageous for three-dimensional and fat-saturated measurements, where there is no flow and in which few or no artifacts arise from chemical shift.

Figure 3:
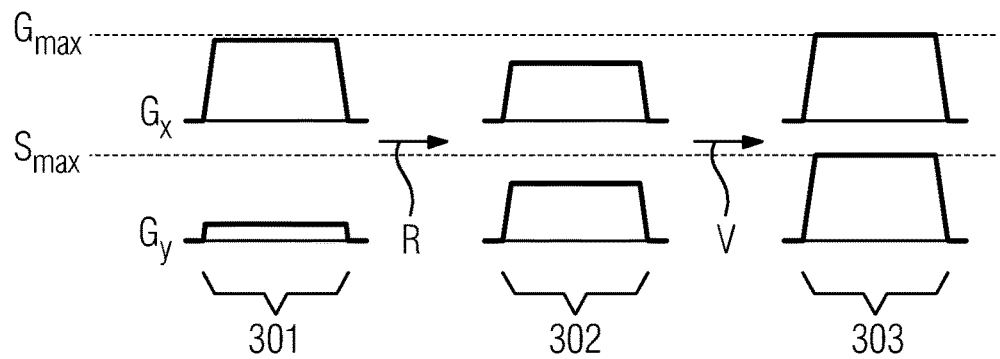
FIG. 3 depicts a gradient diagram according an embodiment of optimizing a slice orientation.

Embodiments for optimizing slice orientation uses the fact that rotations can produce particularly advantageous combinations in which the gradients are distributed optimally, as illustrated in FIG. 3. The original slice orientation results in a gradient distribution 301 in which the gradient strength and the gradient slew rate on the x-axis are significantly higher than on the y-axis. To improve clarity, this example is confined to two gradient axes, the x-axis and the y-axis. It is straightforward, however, to extend the approach also to three axes.

A suitable rotation R about the z-axis through a preference angle produces an optimum distribution of the gradient strength and the gradient slew rate on the x-axis and the y-axis. In particular, as a result of this rotation R, the gradient strength and/or gradient slew rate has an equal fraction of the corresponding maximum gradient strength and/or maximum gradient slew rate. Since this illustration makes the simplifying assumption that the maximum gradient strength $G_{max}$ is of equal magnitude on both axes, the fraction is also the same size, e.g. the gradient strengths are of equal magnitude on the x-axis and the y-axis for the gradient distribution 302. Similar considerations also apply to the gradient slew rate $S_{max}$.

In addition, act 440 includes an amplification V that increases the gradient strengths to such a level that the possible gradient strengths $G_{max}$ on the gradient axes x and y are utilized in full, as depicted by the gradient distribution 303. By the resultant superposition of the gradient fields, it is possible to produce a superimposed gradient field that has a gradient strength that is higher than the maximum gradient strength $G_{max}$ of a single gradient axis. By rotating the original slice orientation through the preference angle it is possible to maximize a superimposed gradient strength and/or a superimposed gradient slew rate.

A preference angle may be determined for each of a plurality of points in time of a pulse sequence, and a resultant preference angle is determined from the plurality of preference angles.

Said resultant preference angle can be determined, for example, by increasing the variable buffer and incrementing the amplification V for each of the preference angles until there is just one of the preference angles left at which the at least one device limitation is not exceeded. This preference angle is defined as the resultant preference angle.

Another embodiment might involve defining an angle at each specifiable increment in an angle range of 0 to 360°, for instance at every 5° increment, to be candidates for the resultant preference angle. Then, the amplification V for each of these angles is incremented until there is just one of the preference angles left at which the at least one device limitation is not exceeded. This angle is defined as the resultant preference angle.

Finally, the method described in detail above and the presented magnetic resonance machine are merely exemplary embodiments that can be modified by a person skilled in the art in a wide variety of ways without departing from the scope of the present invention. In addition, the use of the indefinite article "a" or "an" does not rule out the possibility of there also being more than one of the features concerned. Likewise, the term "unit" does not exclude the possibility that the components in question consist of a plurality of interacting sub-components, which may also be spatially distributed if applicable.

To summarize, a method and a device and a computer program product are provided that can be used, on the one hand, to obtain an optimum performance from a gradient system according to a slice orientation angle. On the other hand, the method, device and computer program product can be used to facilitate simple operation.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

We claim:

1. A method for optimizing a slice orientation for an examination using a magnetic resonance machine having one or more gradient axes for improving image quality and/or reducing examination time, the method comprising:
providing at least one device limitation of the magnetic resonance machine, wherein the least one device limitation comprises for at least one of the one or more gradient axes: a maximum gradient strength, a maximum gradient slew rate, or the maximum gradient strength and the maximum gradient slew rate;
providing at least one pulse sequence of the examination;
providing an original slice orientation resulting from the at least one pulse sequence;
determining rotational-angle information from the at least one device limitation, the at least one pulse sequence, and the original slice orientation, wherein the rotational-angle information comprises an angle range within which the original slice orientation is configured to rotate without exceeding the at least one device limitation;
adjusting the original slice orientation such that the at least one device limitation is not exceeded; and
capturing, by the magnetic resonance machine, measurement data using the adjusted slice orientation.

2. The method of claim 1, wherein the at least one device limitation comprises a variable buffer.

3. The method of claim 2, wherein the rotational-angle information comprises data indicative of whether a possible rotation of the original slice orientation exists without exceeding the at least one device limitation.

4. The method of claim 1, wherein the rotational-angle information comprises data indicative of whether a possible rotation of the original slice orientation exists without exceeding the at least one device limitation.

5. The method of claim 1, further comprising:
defining at least one angle value inside or outside the angle range,
wherein the adjusted slice orientation is based on the at least one angle value,
wherein, when the at least one angle value is defined outside the angle range, the at least one pulse sequence of the examination or the at least one device limitation is changed.

6. The method of claim 5, wherein the rotational-angle information comprises a preferred angle of rotation, and
wherein, on rotating the original slice orientation through the preferred angle of rotation, a gradient strength, a gradient slew rate, or the gradient strength and the gradient slew rate is distributed optimally onto at least two gradient axes.

7. The method of claim 5, wherein the measurement data is captured from a volume comprising at least two different slices having the adjusted slice orientation,
wherein a cross-sectional image is reconstructed from the measurement data, and
wherein the orientation of the cross-sectional image differs from the adjusted slice orientation.

8. The method of claim 1, wherein the rotational-angle information comprises a preferred angle of rotation, and
wherein, on rotating the original slice orientation through the preferred angle of rotation, a gradient strength, a gradient slew rate, or the gradient strength and the gradient slew rate is distributed optimally onto at least two gradient axes.

9. The method of claim 8, wherein, when rotating the original slice orientation through the preferred angle of rotation, the gradient strength, the gradient slew rate, or both the gradient strength and the gradient slew rate on each gradient axis of at least two gradient axes has an equal fraction of a corresponding maximum gradient strength, a maximum gradient slew rate, or both the maximum gradient strength and the maximum gradient slew rate.

10. The method of claim 9, further comprising:
determining a preferred angle of rotation for each point in time of a plurality of points in time of a pulse sequence; and
determining a resultant preferred angle of rotation from the plurality of preferred angles.

11. The method of claim 8, further comprising:
determining a preferred angle of rotation for each point in time of a plurality of points in time of a pulse sequence; and
determining a resultant preferred angle of rotation from the plurality of preferred angles.

12. The method of claim 11, further comprising:
superimposing a gradient strength and/or a gradient slew rate by simultaneous switching of gradients on the least two gradient axes;
wherein the superimposed gradient strength, the superimposed gradient slew rate, or both the superimposed gradient strength and the superimposed gradient slew rate is maximized over the plurality of points in time of the pulse sequence by rotating the original slice orientation through the resultant preferred angle.

13. The method of claim 1, wherein the measurement data is captured from a volume comprising at least two different slices having the adjusted slice orientation,
wherein a cross-sectional image is reconstructed from the measurement data, and
wherein the orientation of the cross-sectional image differs from the adjusted slice orientation.

14. A magnetic resonance machine for capturing improved image quality and/or reducing examination time, the magnetic resonance machine comprising:
gradient coils having one or more gradient axes; and
an analysis unit configured to:
determine rotational-angle information using at least one device limitation of the magnetic resonance machine, at least one pulse sequence, and an original slice orientation resulting from the at least one pulse sequence, wherein the rotational-angle information comprises an angle range within which the original slice orientation is configured to rotate without exceeding the at least one device limitation; and
adjust the original slice orientation such that the at least one device limitation is not exceeded,
wherein the magnetic resonance machine is configured to capture measurement data using the adjusted slice orientation.

15. The magnetic resonance machine of claim 14, further comprising:
a user interface for one or more of: adjusting a reserve margin, adjusting a safety margin, outputting an angle range, defining an angle value, changing the pulse sequence of the examination, and changing the device limitation.

16. A computer-readable data storage medium storing a computer program on a magnetic resonance machine, that when executed by a processor, is operable to:
provide at least one device limitation of the magnetic resonance machine, wherein the least one device limitation comprises for at least one of the one or more gradient axes: a maximum gradient strength, a maximum gradient slew rate, or the maximum gradient strength and the maximum gradient slew rate;
provide at least one pulse sequence of an examination;
provide an original slice orientation resulting from the at least one pulse sequence;
determine rotational-angle information from the at least one device limitation and from the at least one pulse sequence and the original slice orientation, wherein the rotational-angle information comprises an angle range within which the original slice orientation is configured to rotate without exceeding the at least one device limitation;
adjust the original slice orientation such that the at least one device limitation is not exceeded; and
capture, by the magnetic resonance machine, measurement data using the adjusted slice orientation.

* * * * *